(12) United States Patent
Kuk et al.

(10) Patent No.: US 8,519,471 B2
(45) Date of Patent: Aug. 27, 2013

(54) VERTICAL CHANNEL TYPE NONVOLATILE MEMORY DEVICE AND METHOD FOR FABRICATING THE SAME

(75) Inventors: Seoung-Woo Kuk, Gyeonggi-do (KR); Kang-Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 249 days.

(21) Appl. No.: 12/964,233

(22) Filed: Dec. 9, 2010

(65) Prior Publication Data

US 2011/0147823 A1 Jun. 23, 2011

(30) Foreign Application Priority Data

Dec. 18, 2009 (KR) .................. 10-2009-0127157

(51) Int. Cl.
*H01L 29/792* (2006.01)

(52) U.S. Cl.
USPC ............ 257/324; 257/E29.262; 257/E21.649; 438/268

(58) Field of Classification Search
USPC .......... 257/324, E29, 262, E21.643, E21.679; 438/268, 591–594
See application file for complete search history.

(56) References Cited

FOREIGN PATENT DOCUMENTS

| JP | 2009-158775 | 7/2009 |
|---|---|---|
| JP | 2009-224466 | 10/2009 |
| JP | 2009-277770 | 11/2009 |
| KR | 1020090047614 | 5/2009 |

OTHER PUBLICATIONS

Machine translation of IDS reference JP 2009-224466.*
H. Tanaka et al., "Bit Cost Scalable Technology with Punch and Plug Process for Ultra High Density Flash Memory", 2007 Symposium on VLSI Technology Digest of Technical Papers, 2007, pp. 14-15.
White et al., "Characterization of Scaled SONOS EEPROM Memory Devices for Space and Military Systems", Non-Volatile Memory Technology Symposium, Nov. 2004, pp. 51-59, IEEE.
Lusky et al., "Investigation of Channel Hot Electron Injection by Localized Charge-trapping Nonvolatile Memory Devices", IEEE Transactions on Electron Devices, vol. 51, No. 3, Mar. 2004, pp. 444-451.
Notice of Preliminary Rejection issued from Korean Intellectual Property Office on Apr. 26, 2011.
Notice of Allowance issued from Korean Intellectual Property Office on Sep. 30, 2011.

* cited by examiner

*Primary Examiner* — Julio J Maldonado
*Assistant Examiner* — Sonya D McCall Shepard
(74) *Attorney, Agent, or Firm* — IP & T Group LLP (57) ABSTRACT

A method for fabricating a vertical channel type nonvolatile memory device includes forming alternately a plurality of interlayer dielectric layers and a plurality of conductive layers over a substrate, forming a trench having a plurality of recesses on a surface of the trench by etching the plurality of interlayer dielectric layers and a plurality of conductive layers, wherein the plurality of recesses are formed at a certain interval on the surface of the trench, forming a charge blocking layer over a plurality of surfaces of the plurality of recesses, forming a charge storage layer over the charge blocking layer for filling a plurality of the remaining recesses with a charge storage material, forming a tunnel dielectric layer to cover the charge storage layer, and forming a vertical channel layer by filling the remaining trench.

4 Claims, 7 Drawing Sheets

VERTICAL CHANNEL TYPE NONVOLATILE MEMORY DEVICE AND METHOD FOR FABRICATING THE SAME

CROSS-REFERENCE TO RELATED APPLICATIONS

The present application claims priority of Korean Patent Application No. 10-2009-0127157, filed on Dec. 18, 2009, which is incorporated herein by reference in its entirety.

BACKGROUND OF THE INVENTION

Exemplary embodiments of the present invention relate to a memory device and a method for fabricating the same, and more particularly, to a vertical channel type nonvolatile memory device and a method for fabricating the same.

A nonvolatile memory device is a memory device in which stored data is maintained even though a power is not supplied. As the degree of integration increases, a fabrication of a memory device having a two-dimensional structure, i.e., a memory device having memory cells fabricated in a single layer over a silicon substrate, may reach limits. Thus, a nonvolatile memory device having a three-dimensional structure, i.e., a memory device having memory cells that are vertically stacked over a silicon substrate, may be used.

Referring to the paper released on 2007, "H. Tanaka, M. Kido, K. Yahashi, M. Oomura, R. Katsumata, M. Kito, Y. Fukuzumi, M. Sato, Y. Nagata, Y. Matsuoka, Y. Iwata, H. Aochi, and A. Nitayama, entitled 'Bit Cost Scalable Technology with Punch and Plug Process for Ultra High Density Flash Memory,' 2007 Symposium on VLSI Technology Digest of Technical Papers, Page(s): 14-15," by forming the string of a NAND flash memory device vertically from a substrate, the degree of integration can be significantly increased when compared to the conventional two-dimensional memory device.

In a NAND flash memory device having the three-dimensional structure as described above, data may be stored in a charge storage layer, e.g., a charge trap layer such as a nitride layer. Referring to the paper released on 2004, "White, M. H., Adams, D. A., Murray, 3. R., Wrazien, S., Yijie Zhao, Yu Wang, Khan, B., Miller, W., and Mehrotra, R., entitled 'Characterization of Scaled SONOS EEPROM Memory Devices for Space and Military Systems', Non-Volatile Memory Technology Symposium, 15-17 Nov. 2004 Page(s): 51-59", data can be stored using a nitride layer instead of a conventional floating gate electrode.

Hereafter, the construction of a conventional nonvolatile memory device having a three-dimensional structure and the problems occurred therein will be described in detail with reference to a drawing.

Figure 1:
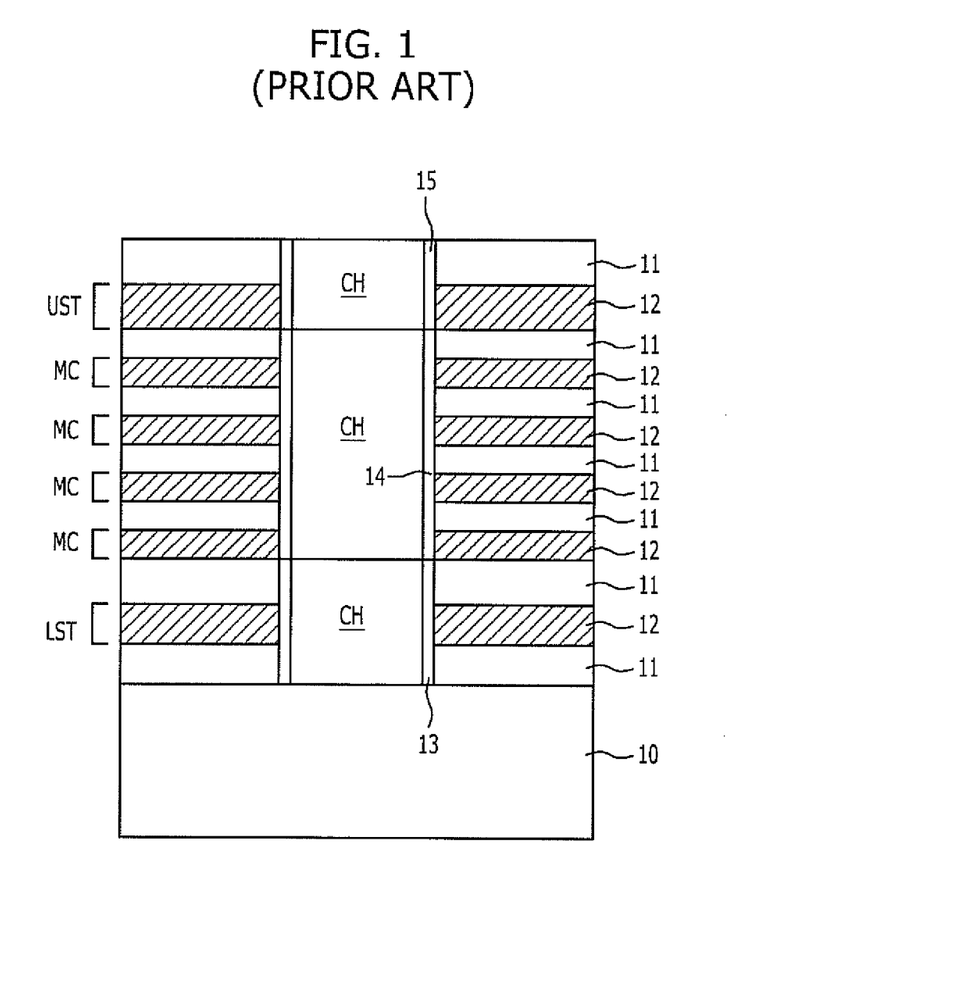
FIG. 1 is a cross-sectional view illustrating the construction of a conventional nonvolatile memory device having a three-dimensional structure.

FIG. 1 is a cross-sectional view illustrating the construction of a conventional nonvolatile memory device having a three-dimensional structure. FIG. 1 specifically illustrates the cross-section of a vertical channel type nonvolatile memory device.

Referring to FIG. 1, in a conventional vertical channel type nonvolatile memory device, a lower selection transistor LST, a plurality of memory cells MC, and an upper selection transistor UST may be sequentially stacked along channels CH which are vertically arranged on the surface of a substrate 10.

A method for fabricating the vertical channel type nonvolatile memory device constructed as mentioned above will be briefly described below.

An interlayer dielectric layer 11 and a conductive layer 12 for a gate electrode may be stacked on the substrate 10 which include underlying structures required for the operation of a cell array. Subsequently, a trench may be formed by etching the interlayer dielectric layer 11 and the conductive layer 12 for a gate electrode.

After forming a gate dielectric layer 13 on the inner surfaces of the trench, a channel CH may be formed by filling the trench with a material for a channel layer. In this way, the lower selection transistor LST may be formed.

A plurality of interlayer dielectric layers 11 and a plurality of conductive layers 12 may be alternately stacked on the resultant structure including the lower selection transistor LST. By etching the plurality of interlayer dielectric layers 11 and the plurality of conductive layers 12, a trench which exposes the channel CH of the lower selection transistor LST may be formed.

After sequentially forming a charge blocking layer, a charge trap layer and a tunnel isolation layer 14 on the inner surfaces of the trench, a channel CH may be formed by filling the trench with a layer for a channel. In this way, the plurality of memory cells MC may be formed along the channel CH which is vertically arranged on the substrate 10.

An interlayer dielectric layer 11 and a conductive layer 12 for a gate electrode may be stacked on the resultant structure including the plurality of memory cells MC. Subsequently, a trench may be formed by etching the interlayer dielectric layer 11 and the conductive layer 12 for a gate electrode to expose the channel CH of the memory cells MC.

After forming a gate dielectric layer 15 on the inner surfaces of the trench, a channel CH may be formed by filling the trench with a layer for a channel. In this way, the upper selection transistor UST may be formed.

However, in the conventional art as described above, the charge trap layer may be formed on the inner surfaces of the trench. Therefore, a resultant structure in which the charge trap layers of the plurality of memory cells MC are stacked along the channel CH may be connected with one another, and accordingly, charges may migrate among adjoining memory cells MC. The migration of the charges may cause a shift of the threshold voltages (Vt) of the memory cells MC, and thus the cycling characteristics and data retention characteristics of the memory device may deteriorate. Thus, the reliability of the memory device may deteriorate.

Such a problem is described in detail in the paper released on 2004, "Lusky, E., Shacham-Diamand, Y., Mitenberg, G., Shappir, A., Bloom, I., Eitan, B., entitled 'Investigation of Channel Hot Electron Injection by Localized Charge-trapping Nonvolatile Memory Devices', Electron Devices, IEEE Transactions on Volume 51, Issue 3, March 2004 Page(s): 444-451."

Meanwhile, in the case of a charge storage layer such as a polysilicon layer, for storing charges in a conductive band, the charges stored in the charge storage layer can freely migrate. In other words, the charges can more freely migrate in the polysilicon layer than in the charge trap layer which traps charges in a deep level trap site.

Accordingly, it is difficult to apply the charge storage layer such as the polysilicon layer, in which charges can freely migrate, to the vertical channel type nonvolatile memory device constructed as described above, because not only the reliability of the memory device may not be secured due to the migration of charges between adjoining memory cells, but also the memory cells may not operate properly.

SUMMARY OF THE INVENTION

Embodiments of the present invention are directed to a vertical channel type nonvolatile memory device and a method for fabricating the same.

In accordance with an exemplary embodiment of the present invention, a method for fabricating a vertical channel type nonvolatile memory device includes: forming alternately a plurality of interlayer dielectric layers and a plurality of conductive layers over a substrate; forming a trench having a plurality of recesses on a surface of the trench by etching the plurality of interlayer dielectric layers and a plurality of conductive layers, wherein the plurality of recesses are formed at a certain interval on the surface of the trench; forming a charge blocking layer over a plurality of surfaces of the plurality of recesses; forming a charge storage layer over the charge blocking layer for filling a plurality of the remaining recesses with a charge storage material; forming a tunnel dielectric layer to cover the charge storage layer; and forming a vertical channel layer by filling the remaining trench.

In accordance with an embodiment of the present invention, a method for fabricating a vertical channel type nonvolatile memory device includes: stacking alternately a plurality of interlayer dielectric layers and a plurality of conductive layers over a substrate; etching the plurality of interlayer dielectric layers and a plurality of conductive layers, and defining a trench which exposes a surface of the substrate and has, on sidewalls thereof, a plurality of recesses defined with a predetermined interval; forming sequentially a charge blocking layer, a charge trap layer or charge storage layer and a tunnel dielectric layer over a surface of a resultant structure which is defined with the trench; conducting an anisotropic etching process such that portions of the charge trap layer or charge storage layer which are formed on inner surfaces of the trench excluding the recesses are exposed; and oxidating the exposed portions of the charge trap layer or charge storage layer such that portions of the charge trap layer or charge storage layer which are respectively formed in the recesses are separated from one another.

In accordance with an embodiment of the present invention, a method for fabricating a vertical channel type nonvolatile memory device includes: stacking alternately a plurality of interlayer dielectric layers and a plurality of conductive layers over a substrate; etching unisotropically the plurality of interlayer dielectrics and the plurality of conductive layers, and defining a trench which exposes a surface of the substrate; etching selectively a partial thickness of the plurality of conductive layers which are exposed on inner surfaces of the trench, through conducting an isotropic etching process, and defining a plurality of recesses on the inner surfaces of the trench; forming a charge blocking layer on a surface of a resultant structure which is defined with the trench; forming a charge trap layer or charge storage layer on a surface of a resultant structure which is formed with the charge blocking layer; conducting an unisotropic etching process such that portions of the charge trap layer or charge storage layer which are formed on the inner surfaces of the trench excluding the recesses are removed; and forming a tunnel dielectric layer on a surface of a resultant structure which has undergone the unisotropic etching process.

In accordance with another exemplary embodiment of the present invention, a vertical channel type nonvolatile memory device includes: a vertical channel; and a plurality of memory cells stacked along the vertical channel wherein the plurality of memory cells respectively include a charge storage layer which are separated from another charge storage layer.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 2A to 2D are cross-sectional views illustrating the process of a method for fabricating a nonvolatile memory device in accordance with an exemplary embodiment of the present invention. It is to be noted that, for the sake of convenience in explanation, a plurality of memory cells are mainly illustrated and a lower selection transistor and so on are omitted.

Figure 2A:
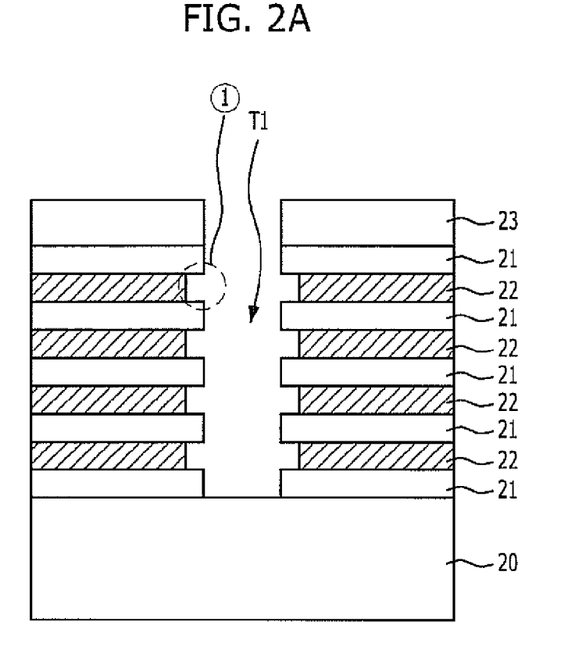
FIGS. 2A to 2D are cross-sectional views illustrating the processes of a method for fabricating a nonvolatile memory device in accordance with an exemplary embodiment of the present invention.

Referring to FIG. 2A, a plurality of interlayer dielectric layers 21 and a plurality of conductive layers 22 may be alternately formed over a substrate 20 which includes a source region, a lower selection transistor, etc.

The interlayer dielectric layers 21 may be arranged to separate a plurality of stacked memory cells from one another. Specifically, the interlayer dielectric layers 21 include oxide layers. The conductive layers 22 may be arranged to form the gate electrodes of the memory cells. Specifically, the conductive layers 22 include polysilicon layers doped with P-type impurities or N-type impurities.

The interlayer dielectric layers 21 and the conductive layers 22 for gate electrodes may be repeatedly stacked over the substrate 20. In the exemplary embodiment of the present invention, for the sake of convenience in explanation, it is illustrated that four memory cells are stacked.

By etching the plurality of interlayer dielectric layers 21 and the plurality of conductive layers 22, a trench T1 may be defined in such a manner that the trench T1 exposes the surface of the substrate 20 and has a plurality of recesses (see the circled number ①) formed at a certain interval on the sidewalls of the trench T1.

A procedure for defining the trench T1 will be described below.

First, a mask pattern 23 may be formed over the resultant structure which is formed with the plurality of interlayer dielectric layers 21 and the plurality of conductive layers 22. By unisotropic etching of the plurality of interlayer dielectric layers 21 and the plurality of conductive layers 22 using the mask pattern 23 as an etch barrier, a trench which exposes the surface of the substrate 20 may be defined. The plurality of conductive layers 22 which are exposed on the inner surfaces of the trench may be selectively etched with a certain etch depth through an isotropic etching process. Through this, the trench T1, which has the recesses ① defined on the inner surfaces thereof at the certain interval, may be defined. As a result, the inner surfaces of the trench T1 may have a saw-tooth structure.

Here, the formation of the recesses ① may be conducted at a condition in which an etching selectivity between the conductive layers 22 and the interlayer dielectric layers 21 is substantial. Through this, only the conductive layers 22 may be selectively etched with the certain etch depth, or the conductive layers 22 may be etched more than the interlayer dielectric layers 21.

Figure 2B:
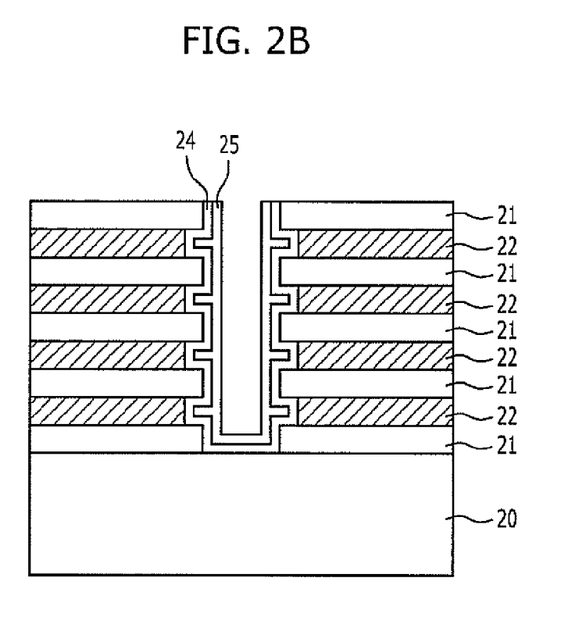

Referring to FIG. 2B, a charge blocking layer 24 may be formed on the entire surface of the resultant structure which comprises the recesses ①.

The charge blocking layer 24 may be arranged to reduce charge migration toward gate electrodes by passing through charge storage layer, and specifically, the charge blocking layer 24 includes an oxide layer which is formed through a thermal oxidation process or a deposition process. Also, the charge blocking layer 24 may be formed to a thickness of a degree capable of separating the gate electrodes and the charge storage layer from each other electrically. Here, the charge blocking layer 24 may be formed on the entire inner surfaces of the trench T1 to a thickness of a degree capable of allowing the surface of recesses ① to be covered while the center portions of the recesses ① are open.

A charge storage layer 25 which includes a charge trap layer may be formed on the entire surface of the resultant structure, i.e., on the charge blocking layer 24.

The charge storage layer 25 may be used as a data storage. The charge storage layer includes a conductive layer (e.g., a polysilicon layer) and the charge trap layer (e.g., a nitride layer). Here, the formation of the charge storage layer 25 may be formed through a deposition process. Also, the charge storage layer 25 may be formed to a thickness for sufficiently filling the open center portions of the recesses ①.

Figure 2C:
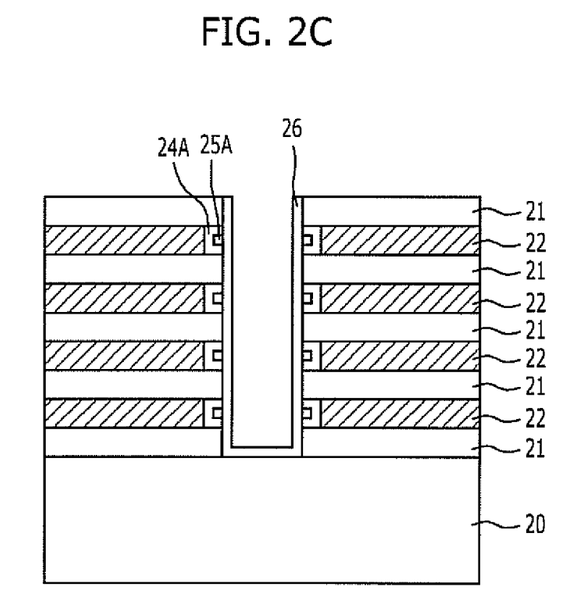

Referring to FIG. 2C, by conducting an anisotropic etching process, the charge storage layer 25 which is formed on the inner surfaces of the trench T1 except for a charge storage layer 25 in the recesses ① may be removed. Of course, the charge blocking layer 24 which is formed on the inner surfaces of the trench T1 except for a charge blocking layer 24 in the recesses ① may be removed as well. In the drawing, the charge blocking layer remaining after the anisotropic etching process is denoted by the reference numeral 24A, and the charge storage layer remaining after the anisotropic etching process is denoted by the reference numeral 25A.

Through the above-described anisotropic etching process, portions of the charge storage layer 25A, which are arranged in the open center portions of the plurality of recesses ①, are respectively separated from one another. In other words, by conducting the anisotropic etching process, charge trap layers or charge storage layers 25A for a plurality of memory cells which are to be formed through subsequent processes can be respectively separated from one another.

A tunnel dielectric layer 26 may be formed on the entire surface of the resultant structure in which the charge storage layers 25A are arranged in the recesses ①. The tunnel dielectric layer 26 may be arranged to be an energy barrier layer in consideration of charge tunneling, and includes an oxide layer.

Figure 2D:
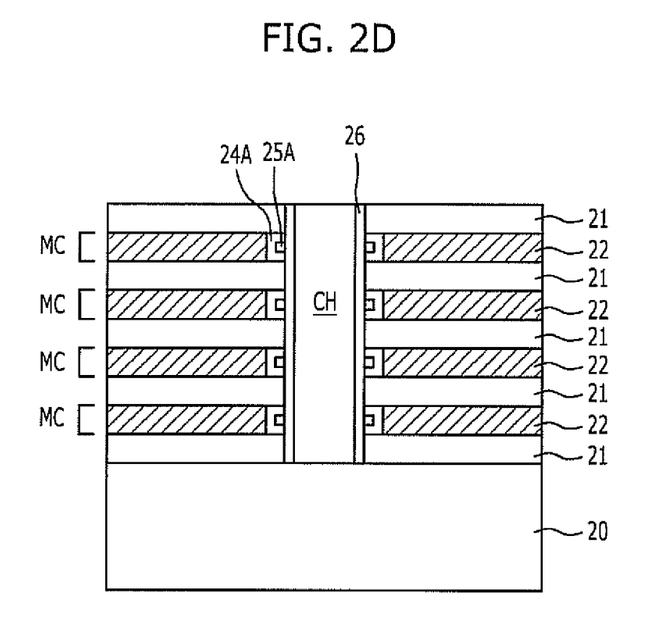

Referring to FIG. 2D, the surface of the substrate 20 on the bottom of the trench T1 may be exposed by conducting an etch-back process. By arranging a layer for a channel in the trench T1 in which the surface of the substrate 20 is exposed, a channel CH may be formed.

Consequently, a plurality of memory cells MC, which are stacked along the channel CH vertically arranged on the substrate 20, are formed.

Through the above-described process of an exemplary embodiment of the present invention, the plurality of memory cells MC which are stacked along the channel CH vertically arranged on the substrate 20, in a manner such that the memory cells MC respectively include the charge storage layers 25A which are separated from one another may be formed. Here, the charge storage layer 25A includes a conductive layer (e.g., a polysilicon layer) and the charge trap layer (e.g., a nitride layer). In particular, due to the fact that the memory cells MC are formed to include the tunnel dielectric layer 26 which surrounds the entire surfaces of the channel CH, the charge trap layers or charge storage layers 25A which are formed on the tunnel dielectric layer 26 in such a way as to be separated from on another by a predefined interval, and the charge blocking layers 24A which are formed to cover the charge trap layers or charge storage layers 25A and block the charge trap layers or charge storage layers 25A and gate electrodes from each other, it is possible to separate the charge trap layers or charge storage layers 25A of the plurality of memory cells MC stacked along the channel CH from one another As a consequence, a shift of threshold voltages due to the migration of charges between adjoining memory cells MC may be decreased. Accordingly, the reliability of a memory device may be improved. Furthermore, since the migration of charges among the memory cells MC may be substantially prevented, the conductive layer, e.g., a polysilicon layer, may be used as a data storage.

Figure 3A:
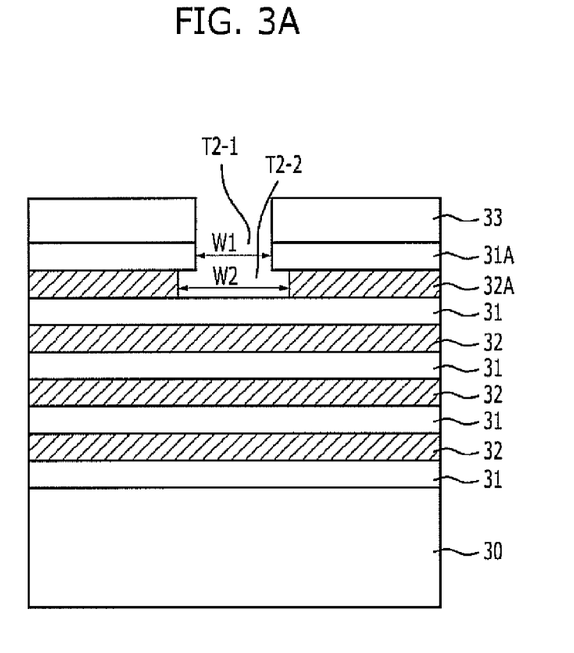
FIGS. 3A to 3C are cross-sectional views illustrating the processes of a method for fabricating a nonvolatile memory device in accordance with another exemplary embodiment of the present invention.
Figure 3B:
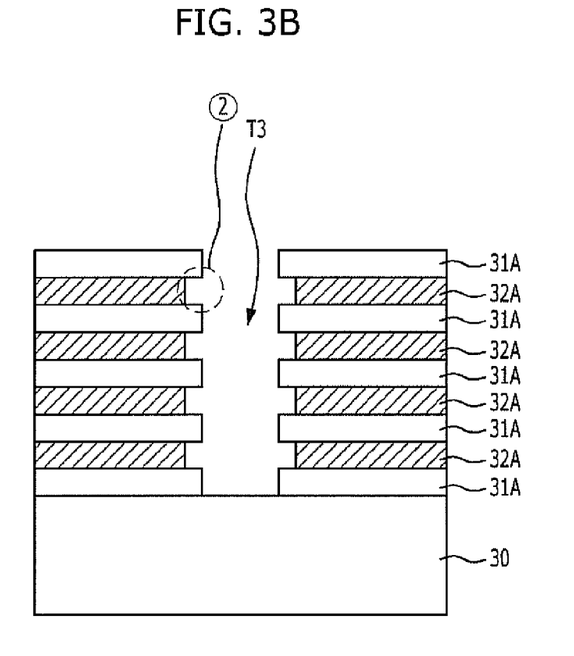
Figure 3C:
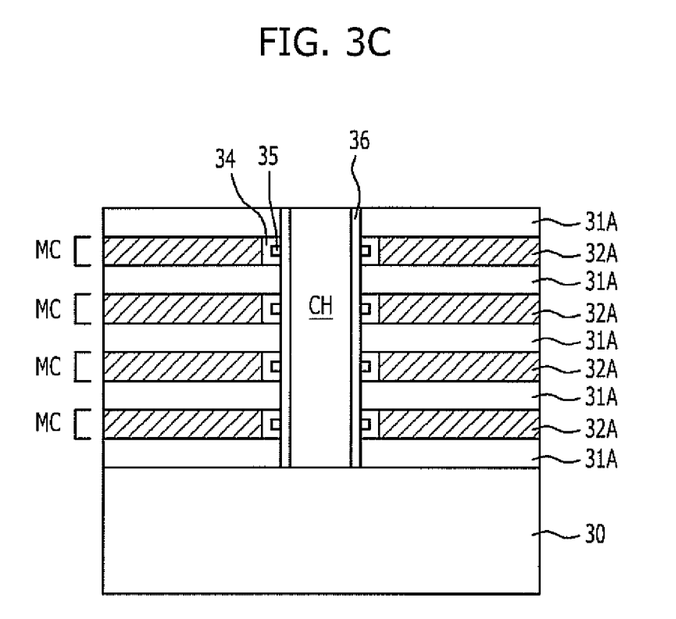

FIGS. 3A to 3C are cross-sectional views illustrating the processes of a method for fabricating a nonvolatile memory device in accordance with another exemplary embodiment of the present invention. Any repetitious description to the extent the description has been provided with respect to the previous exemplary embodiment will be avoided to the extent feasible.

Referring to FIG. 3A, a plurality of interlayer dielectric layers 31 and a plurality of conductive layers 32 may be alternately formed over a substrate 30 which includes a source region, a lower selection transistor, etc.

A mask pattern 33 for defining a trench may be formed on the resultant structure which includes the plurality of interlayer dielectric layers 31 and the plurality of conductive layers 32.

By etching the interlayer dielectric layer 31 through an anisotropic etching process using the mask pattern 33 as an etch barrier, a first trench T2-1 with a first width W1 may be formed. Thus, by etching of the uppermost interlayer dielectric layer 31, the first trench T2-1 may be formed. In the drawing, the interlayer dielectric layer which is unisotropically etched is denoted by the reference numeral 31A.

By isotropic etching of the conductive layer 32 which is exposed on the bottom of the first trench T2-1, a second trench T2-2 with a second width W2 greater than the first width W1 may be formed. In the drawings, the conductive layer which is isotropically etched is denoted by the reference numeral 32A.

Referring to FIG. 3B, the above-described step for forming of the first trench T2-1 and the above-described step for forming of the second trench T2-2 may be repeatedly conducted until the surface of the substrate 30 is exposed.

Since the anisotropic etching processes for the interlayer dielectric layers 31 may be repeatedly conducted using the mask pattern 33 as an etch barrier, first trenches T2-1 may have, for example, the same width as the first width W1. Also, as the conductive layers 32 which are exposed on the bottoms of the first trenches T2-1 may be isotropically etched, second trenches T2-2 may have, for example, the same width as the second width W2.

Consequently, a trench T3 may be formed in such a manner that the trench T3 exposes the surface of the substrate 30 and has a plurality of recesses (see the circled number ②) formed with a certain interval on the sidewalls of the trench T3.

In the case where the trench T3 is defined by repeatedly conducting the anisotropic etching and the isotropic etching for the plurality of interlayer dielectric layers 31 and the plurality of conductive layers 32 alternately stacked as described above, the number of processes can be decreased when compared to the aforementioned first embodiment. For example, in the first embodiment, after conducting an etching process total 9 times to define the trench T1 which exposes the surface of the substrate 20, the isotropic etching process for defining the recesses ① is conducted. That is to say, in the first embodiment, an etching process should be conducted total 10 times. Conversely, in the second embodiment, 5 times of unisotropic etching and 4 times of isotropic etching are alternately conducted, and therefore, an etching process is conducted only total 9 times. Therefore, fabrication processes can be simplified in the second embodiment when compared to the first embodiment.

In the first embodiment, the anisotropic etching process is conducted continuously 9 times. In this case, since an etching depth gradually increases, a problem is likely to be caused in that an etched width can be gradually decreases toward the bottom of the trench T1. Conversely, in the second embodiment, since the unisotropic etching process and the isotropic etching process are alternately conducted, the uniformity of the width of the trench T3 can be ensured.

Referring to FIG. 3C, after forming a charge blocking layer 34 on the entire surface of the resultant structure which includes the trench T3, a charge storage layer 35 may be formed in the plurality of recesses ②. Here, the charge storage layer includes a conductive layer (e.g., a polysilicon layer) and the charge trap layer (e.g., a nitride layer). As mentioned above, after forming the charge storage layer 35 on the entire surface of the resultant structure including the charge blocking layer 34, by conducting an anisotropic etching process, the charge storage layer 35 may remain, for example, only in the plurality of recesses ②. Of course, in this process, the charge blocking layer 34 which is formed on the inner surfaces of the trench T3 excluding the recesses ② may be removed as well.

A tunnel dielectric layer 36 may be formed on the entire surface of the resultant structure in which the charge storage layer 35 is filled in the plurality of recesses ②.

After conducting an etch-back process until the surface of the substrate 30 is exposed on the bottom of the trench T1, a channel CH is formed by filling the trench T3 in which the surface of the substrate 30 is exposed with a layer for a channel.

Consequently, a plurality of memory cells MC, which are stacked along the channel CH vertically arranged on the substrate 30, may be formed.

Figure 4A:
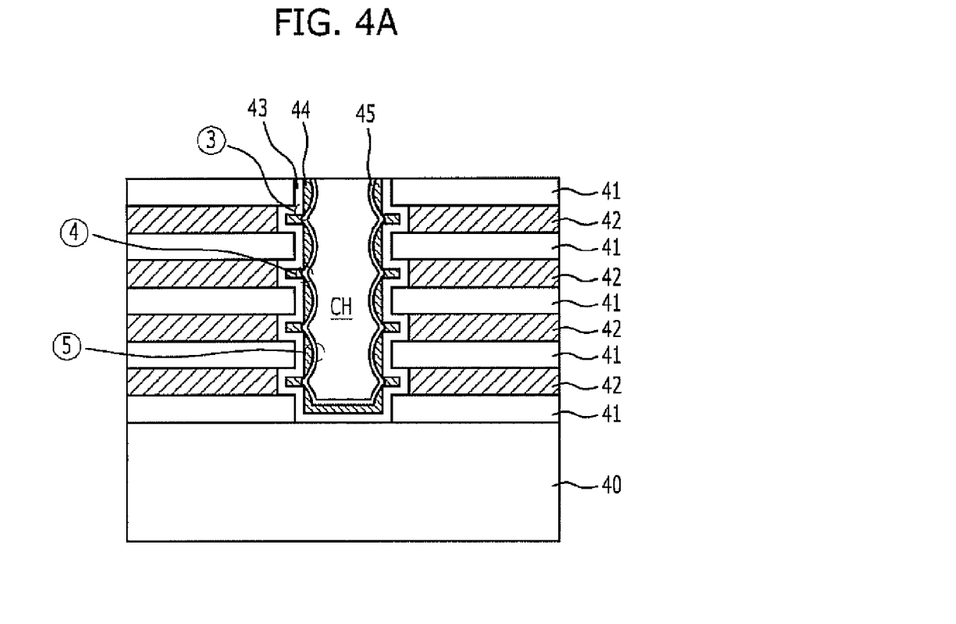
FIGS. 4A to 4C are cross-sectional views illustrating the processes of a method for fabricating a nonvolatile memory device in accordance with yet another exemplary embodiment of the present invention.
Figure 4B:
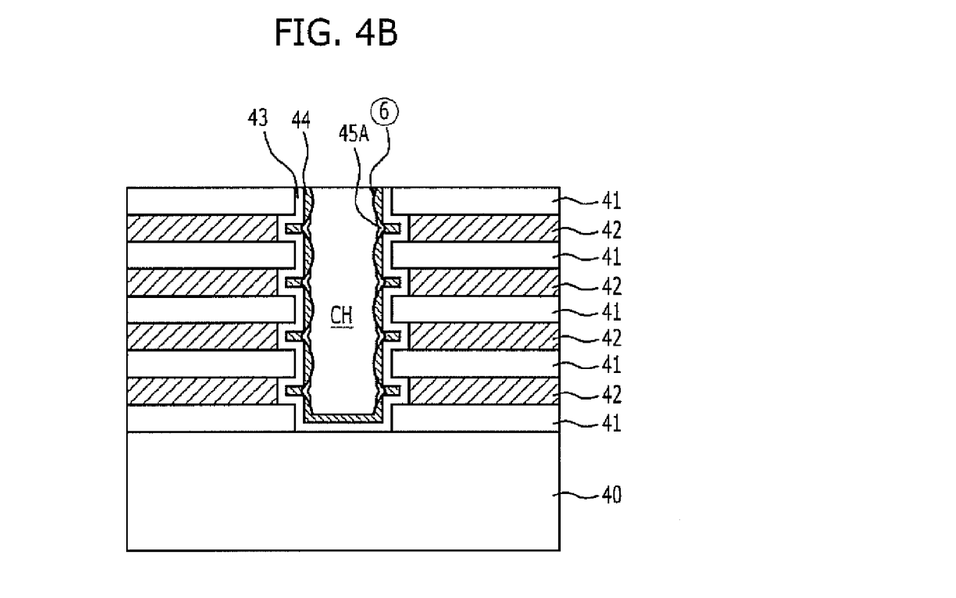
Figure 4C:
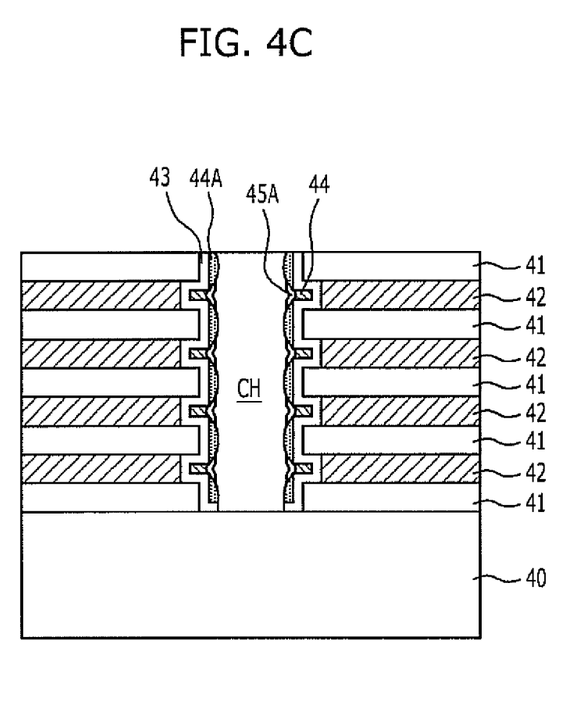

FIGS. 4A to 4C are cross-sectional views illustrating the processes of a method for fabricating a nonvolatile memory device in accordance with yet another exemplary embodiment of the present invention. Any repeated description where the description has been provided with respect to the previous exemplary embodiment will be omitted to the extent feasible.

Referring to FIG. 4A, a plurality of interlayer dielectric layers 41 and a plurality of conductive layers 42 may be alternately formed over a substrate 40 which includes required underlying structures, e.g., a source region, a lower selection transistor, etc.

By etching the plurality of interlayer dielectric layers 41 and the plurality of conductive layers 42, a trench may be defined in such a manner that the trench exposes the surface of the substrate 40 and has a plurality of recesses defined with a certain interval on the sidewalls of the trench.

A charge blocking layer 43, a charge storage layer 44 and a tunnel dielectric layer 45 may be sequentially formed on the entire surface of the resultant structure including the trench.

Here, the charge storage layer 44 may be formed through a deposition process. In the case of forming a material layer through a deposition process, the thickness of the material layer may vary from region to region depending upon the step coverage properties of a material. Accordingly, when forming the charge storage layer 44 on the inner surfaces of the trench having a saw-tooth structure by a deposition method that has a relatively poor step coverage, the charge storage layer 44 may not be actually deposited on corner portions (see the circled number ③) and may be substantially deposited on the other portions. Here, the charge storage layer includes a conductive layer (e.g., a polysilicon layer) and the charge trap layer (e.g., a nitride layer).

In this way, in the case of depositing the charge storage layer 44 through a deposition method having a poor step coverage, portions of the charge storage layer 44 may be separated from one another due to the presence of the recesses. In other words, portions of the charge storage layer 44 corresponding to adjoining memory cells may be primarily separated from one another owing to the deposition method. Furthermore, the portions of the charge storage layer 44 which are formed in the recesses and portions of the charge storage layer 44 which are formed on the inner surfaces of the trench excluding the recesses may be separated from each other by the presence of the tunnel dielectric layer 45.

Referring to FIG. 4B, an isotropic etching process may be conducted such that the portions of the charge storage layer 44, which are formed on the inner surfaces of the trench excluding the recesses, may be exposed.

The tunnel dielectric layer 45 may be formed on the entire surface of the resultant structure, i.e., on the charge storage layer 44. In this regard, portions of the tunnel dielectric layer 45 which are formed over the recesses may be placed at a relatively low position (see the circled number ④ in FIG. 4A), whereas portions of the tunnel dielectric layer 45 which are formed on the inner surfaces of the trench excluding the recesses may be placed at a relatively high position (see the circled number ⑤ in FIG. 4A).

Accordingly, through the anisotropic etching process, the portions of the tunnel dielectric layer 45 which are formed on the inner surfaces of the trench excluding the recesses may be etched, and thus, the portions of the charge storage layer 44 which are formed on the inner surfaces of the trench excluding the recesses may be exposed (see the circled number ⑥). Since the portions of the tunnel dielectric layer 45 which are formed over the recesses may not be etched, the portions of the charge storage layer 44 which are formed in the recesses may not be exposed.

Of course, through the unisotropic etching process, a portion of the charge storage layer 44 which is formed on the bottom of the trench may be exposed as well.

Referring to FIG. 4C, the portions of the charge storage layer 44 which are exposed may be oxidized through an oxidation process. In the drawing, the oxidized charge storage layer 44 is denoted by the reference numeral 44A.

For example, in the case that the charge storage layer 44 is a polysilicon layer, e.g., an $SiO_2$ layer may be formed through the oxidation process, and in the case that the charge storage layer 44 is a nitride layer, e.g., an SiON layer may be formed through the oxidation process.

As a result, the oxidized charge storage layer 44 formed to surround the tunnel dielectric layer 45, i.e., the oxidized portions of the charge storage layer 44 which are formed between adjoining memory cells may separate the portions of the charge storage layer 44 formed in the recesses. The oxidized charge storage layer 44A may serve as a tunnel dielectric layer.

In this way, the portions of the charge storage layer 44, which are embedded in the recesses, may be secondarily separated by the oxidized charge storage layer 44A. Accordingly, the portions of the charge storage layer 44, which are respectively embedded in the plurality of recesses, may be substantially separated from one another by the tunnel dielectric layer 45A and the oxidized charge storage layer 44A.

In this exemplary embodiment of the present invention, since it is not necessary to conduct a separate process for removing the portions of the charge storage layer which are formed on the inner surfaces of the trench excluding the recesses, fabrication processes may be simplified.

While not shown in the drawings, an oxide layer may be additionally formed on the oxidized charge storage layer 44A.

After conducting an etch-back process until the surface of the substrate 40 is exposed on the bottom of the trench, a channel CH may be formed by filling the trench in which the surface of the substrate 40 is exposed with a layer for a channel.

Consequently, a plurality of memory cells MC, which are stacked along the channel CH vertically arranged on the substrate 40, are formed.

As apparent from the above description, in the exemplary embodiments of the present invention, since charge storage layers of a plurality of memory cells, which are stacked along a channel, may be respectively separated, the shift of the threshold voltages of the memory cells may decrease. As a consequence, the cycling characteristics and the data retention characteristics of a memory device may be enhanced, whereby the reliability of the memory device may be improved.

Furthermore, a charge storage layer formed of the conductive material may be applied to a vertical channel type nonvolatile memory device.

While the present invention has been described with respect to the specific embodiments, it will be apparent to those skilled in the art that various changes and modifications may be made without departing from the spirit and scope of the invention as defined in the following claims.

What is claimed is:

1. A vertical channel type nonvolatile memory device comprising:
    a vertical channel; and
    a plurality of memory cells stacked along the vertical channel,
    wherein each of the plurality of memory cells comprises:
    a tunnel dielectric layer surrounding a surface of the channel;
    a charge storage layer surrounding the tunnel dielectric layer and having portions which are separated from one another by a certain interval; and
    a charge blocking layer surrounding the charge storage layer; and
    wherein the charge storage layer is formed to surround the tunnel dielectric layer, and a portion of the charge storage layer which is formed between adjoining memory cells is oxidized through an oxidation process to serve as the tunnel dielectric layer.

2. The vertical channel type nonvolatile memory device of claim 1, wherein the charge storage layer comprises a nitride layer and the oxidized charge storage layer comprises a SiON.

3. The vertical channel type nonvolatile memory device of claim 1, wherein the charge storage layer comprises a polysilicon layer and the oxidized charge storage layer comprises $SiO_2$.

4. A vertical channel type nonvolatile memory comprising:
    a vertical channel; and
    a plurality of memory cells stacked along the vertical channel,
    wherein each of the memory cells comprises:
    a tunnel dielectric layer arranged between the vertical channel and a charge storage layer:
    the charge storage layer arranged between the tunnel dielectric layer and a charge blocking layer, wherein the plurality of charge storage layers are separated from one another at a certain interval; and
    the charge blocking layer arranged between the charge storage layer and a substrate.

* * * * *